(12) United States Patent
Thompson et al.

(10) Patent No.: US 11,590,563 B2
(45) Date of Patent: Feb. 28, 2023

(54) DIRECTIONAL SOLIDIFICATION CASTING ASSEMBLY AND METHOD

(71) Applicant: General Electric Company, Schenectady, NY (US)

(72) Inventors: Anthony Mark Thompson, Niskayuna, NY (US); Derek MacDormand, Niskayuna, NY (US)

(73) Assignee: GENERAL ELECTRIC COMPANY, Schenectady, NY (US)

(*) Notice: Subject to any disclaimer, the term of this patent is extended or adjusted under 35 U.S.C. 154(b) by 64 days.

(21) Appl. No.: 17/280,249

(22) PCT Filed: Oct. 16, 2018

(86) PCT No.: PCT/US2018/056085
§ 371 (c)(1),
(2) Date: Mar. 26, 2021

(87) PCT Pub. No.: WO2020/081064
PCT Pub. Date: Apr. 23, 2020

(65) Prior Publication Data
US 2022/0048099 A1 Feb. 17, 2022

(51) Int. Cl.
*B22C 9/08* (2006.01)
*B22D 27/04* (2006.01)
*B22C 9/06* (2006.01)

(52) U.S. Cl.
CPC .............. *B22C 9/065* (2013.01); *B22C 9/082* (2013.01); *B22D 27/045* (2013.01)

(58) Field of Classification Search
CPC ............................. B22C 9/082; B22D 27/045
See application file for complete search history.

(56) References Cited

U.S. PATENT DOCUMENTS

| 7,449,063 | B2 | 11/2008 | D'Souza et al. |
| 10,562,093 | B2* | 2/2020 | Bohli ........................ B22C 9/12 |
| 2010/0252224 | A1* | 10/2010 | Boswell .................... B22C 9/04 |
| | | | 164/270.1 |
| 2017/0151605 | A1 | 6/2017 | Marques et al. |

FOREIGN PATENT DOCUMENTS

WO 2007/123874 A2 11/2007

OTHER PUBLICATIONS

International Preliminary Report on Patentability dated Apr. 29, 2021 for corresponding International application No. PCT/US2018/056085 (11 pages).

* cited by examiner

*Primary Examiner* — Kevin E Yoon
(74) *Attorney, Agent, or Firm* — The Small Patent Law Group LLC; Christopher R. Carroll

(57) ABSTRACT

A directional solidification casting assembly includes a directional solidification mold having an interior chamber with a shape of an object to be cast using directional solidification of molten metal in a growth direction of the mold and a feed line conduit. The conduit is fluidly coupled with a container source of the molten metal and is coupled with the mold at a gating. The feed line conduit conveys the molten metal into the mold through the gating for directional solidification of the object to be cast in the mold. At least a downstream portion of the feed line conduit that is between the intermediate location of the feed line conduit and the second open end of the feed line conduit is located below the gating along the growth direction of the mold.

4 Claims, 4 Drawing Sheets

DIRECTIONAL SOLIDIFICATION CASTING ASSEMBLY AND METHOD

FIELD

The subject matter described herein relates to casting assemblies used to manufacture directionally solidified metal components.

BACKGROUND

Many components can be formed using directional solidification techniques. Directional solidification (DS) techniques enable the solidification of materials with grains aligned in a specific direction. Directional and single crystal structures can be created to improve the mechanical and metallurgical properties of the cast materials. These structures can be produced by casting a melt of an alloy. Heat transfer conditions during solidification of the casting are controlled so that a solidification front advances along a growth direction to generate primary columnar crystals or grains and to avoid or reduce nucleation of secondary grains from the melt.

Directional solidification is not, however, without drawbacks. Some known directional solidification casting assemblies include a straight or linear feed line that directs molten metal into a mold via a gating between the feed line and the mold. It has been found by the inventors of this application that these straight feed lines often result in stray metal grains propagating into the mold from the feed line. These stray grains can emerge from the junction between the gating and the mold and into the component being cast in the mold. The stray grains interrupt formation of the single or columnar crystal structure being formed in the mold. For cast objects having low thresholds for such crystal faults, these stray grains can result in a large percentage of the objects being unusable. For example, the inventors have found that use of a straight feed line for the single crystal formation of the blades of turbine engine airfoils has resulted in unacceptable failure rates

BRIEF DESCRIPTION

In one embodiment, a directional solidification casting assembly is provided. The assembly includes a container source of a molten metal, a directional solidification mold having an interior chamber with a shape of an object to be cast using directional solidification of the molten metal in a growth direction of the mold, and a feed line conduit having a length that extends from a first open end to a second open end with an intermediate location between the first and second open ends. The first open end of the feed line conduit is fluidly coupled with the container source. The second open end of the feed line conduit is fluidly coupled with the mold at a gating. The feed line conduit is configured to convey the molten metal into the mold through the gating for directional solidification of the object to be cast in the mold. At least a downstream portion of the feed line conduit that is between the intermediate location of the feed line conduit and the second open end of the feed line conduit is located below the gating along the growth direction of the mold. Optionally, the assembly does not include the container source of the metal, but is fluidly coupled with this container source.

In one embodiment, a directional solidification casting method is provided. The method includes fluidly coupling a first open end of a feed line conduit with a container source of a molten metal and fluidly coupling an opposite, second open end of the feed line conduit with a directional solidification mold at a gating of the mold. The mold has an interior chamber with a shape of an object to be cast using directional solidification of the molten metal in a growth direction of the mold. The method also includes positioning at least a downstream portion of the feed line conduit below the gating of the mold along the growth direction. The downstream portion of the feed line conduit extends between the second open end of the feed line conduit and an intermediate location in the feed line conduit between the first and second open ends. The method also includes directing the molten metal into the mold via the feed line conduit and casting the object in the mold using directional solidification.

In one embodiment, a directional solidification casting assembly is provided. The assembly includes a directional solidification mold having an interior chamber with a shape of an object to be cast using directional solidification of molten metal in a growth direction of the mold and a feed line conduit having a length that extends from a first open end to a second open end. The first open end of the feed line conduit is fluidly coupled with the container source. The second open end of the feed line conduit is fluidly coupled with the mold at a gating. The feed line conduit is configured to convey the molten metal into the mold through the gating for directional solidification of the object to be cast in the mold. The feed line conduit connects with the gating in a downward direction that is oriented at an angle that is closer to the growth direction than to a direction that is perpendicular to the growth direction.

DETAILED DESCRIPTION

The inventive subject matter described herein relates to a directional solidification casting assembly and method that reduces the frequency of stray grains in single crystal castings. The casting assembly modifies the known feed line geometry from a straight channel to one in which the channel first drops below a joint between the feed line and the mold or the object being cast in the mold (e.g., this joint can be referred to as the gating) before rising to the level of the gating. This drop and rising creates a U-shaped bend in the feed line. During the directional casting, the molten metal in the bottom of the feed line solidifies before the gating into the blade, and thus further flow of molten metal from the feed line upstream of the U-bend into the mold is prevented. This solidification and resultant prevention of additional flow of molten metal can prevent stray grains from forming in the feed line or gating and then entering the mold (and object being cast in the mold).

Optionally, the casting assembly can have the feed line attached to the mold (e.g., object being cast, or continuator) at an angle that is close to vertical such that grains grow from the object being cast in the mold (e.g., the turbine blade) into the feed line, rather than vice versa.

Figure 1:
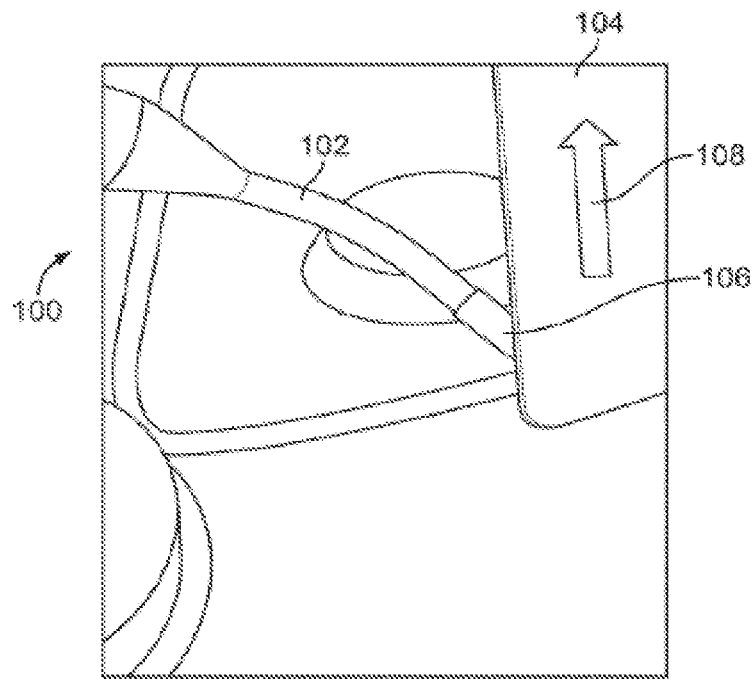
FIG. 1 illustrates one example of a directional solidification casting assembly.

FIG. 1 illustrates one example of a directional solidification casting assembly 100. The casting assembly 100 includes a feed line conduit 102 that defines a channel through which molten metal flows from a container (not shown) into an interior chamber of a mold 104. The feed line conduit 102 is fluidly coupled with the interior of the mold 104 at a gating 106. In operation, molten metal flows from the container and into the mold 104 through the feed line conduit 102. The molten metal is directionally solidified within the mold 104 along a growth direction 108 to form a single crystal or columnar crystal (e.g., several crystal grains aligned in vertical columns along the growth direction 108).

As shown, the feed line conduit 102 is predominantly oriented along a straight line into the mold 104 via the gating 106. While the feed line conduit 102 may have a slight bend or curve, the feed line conduit 102 is angled downward from the container from which the molten metal is supplied to the gating 106 (relative to the vertical or growth direction 108). This orientation results in the molten metal always flowing downward or downhill from the container source of the molten metal through feed line conduit 102 to the gating 106 of the mold 104. During solidification of the molten metal, some of the metal in the feed line conduit 102 can begin to solidify while the metal in the mold 104 solidifies. For a single crystal configuration, the mold 104 may include or be fluidly coupled with a seed crystal grain and a helical grain selector (not shown) beneath the mold 104. For a columnar grain configuration, the mold may include a chamber in which a columnar grain structure can be developed (often known as a starter block).

The metal in the feed line conduit 102 also can solidify and form one or more grains. The grains formed in the feed line conduit 102 are very likely not oriented in the same direction(s) as the crystalline grains formed in the mold 104 due to the grains formed in the feed line conduit 102 not growing from the same seed crystal or pig tail channel as the metal in the mold 104. As described above, this orientation of the feed line conduit 102 can result in metal containing stray grains formed in the feed line conduit 102 flowing into the mold 104 and/or the flow of the metal breaking off tips of dendrites that are solidifying in the mold 104. Either of these scenarios can disrupt the growth of the single crystal columnar structure being formed in the mold 104 and can introduce stray grains into the mold 104. The stray grains can form weaker locations in the cast objects and can result in the objects being unable to be used. For example, some turbine blades cannot have stray grains due to the introduction of mechanical weakness at the stray grains.

Figure 2:
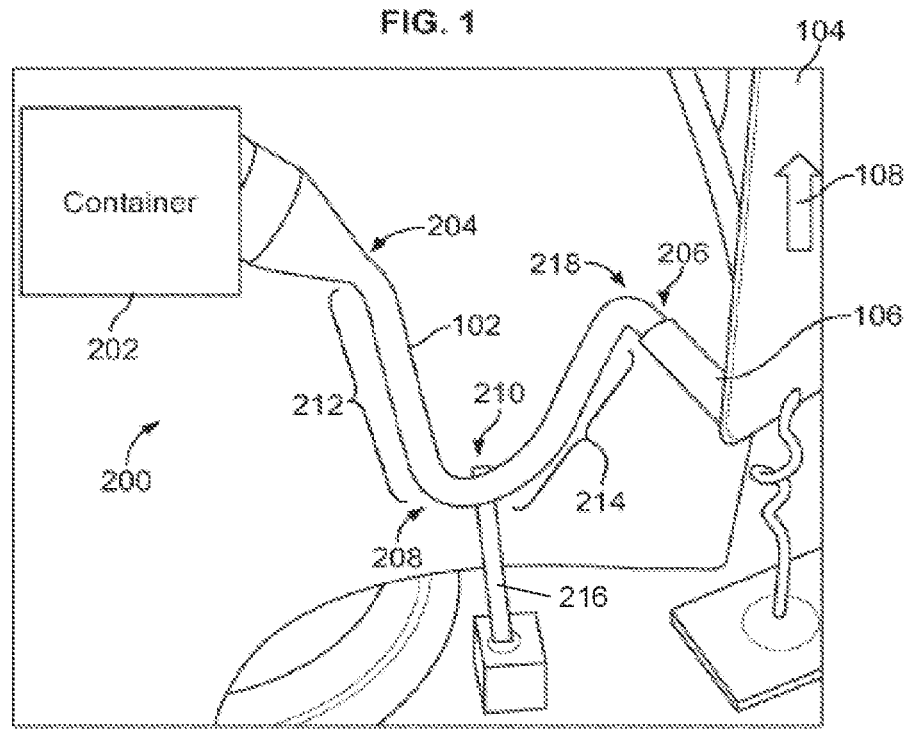
FIG. 2 illustrates another example of a directional solidification casting assembly.

FIG. 2 illustrates another example of a directional solidification casting assembly 200. The casting assembly 200 includes a container 202 that holds the molten metal and operates as a source of the metal for the casting process. The casting assembly 200 also includes the feed line conduit 102, the mold 104, and the gating 106. The feed line conduit 102 includes open ends 204, 206 at opposite ends of the length of the feed line conduit 102. One open end 204 fluidly couples the feed line conduit 102 with the container 202 so that the feed line conduit 102 can receive the molten metal from the container 202. The other open end 206 of the feed line conduit 102 fluidly couples the feed line conduit 102 with the gating 106 of the mold 104. As described above, the feed line conduit 102 conveys or directs the molten metal from the container 202 to the mold 104 for directional solidification of the object to be cast in the mold 104.

For a single crystal configuration, the mold 104 may include or be fluidly coupled with a seed crystal grain and a grain selector (not shown) beneath the mold 104. For a columnar grain configuration, the mold may include a chamber in which a multiple columnar grain structure can be developed (often known as a starter block).

One difference between the casting assembly 100 shown in FIG. 1 and the casting assembly 200 shown in FIG. 2 is the shape of the feed line conduit 102. As shown in FIG. 2, the feed line conduit 102 has a convex U-bend 208 (e.g., convex relative to the growth direction 108). This U-bend 208 is located at or includes an intermediate location 210 of the feed line conduit 102 that is located between the ends 204, 206 of the feed line conduit 102. Optionally, the intermediate location 210 can be at the middle location or midway point along the length of the feed line conduit 102 from one end 204 or 206 to the other end 206 or 204 of the feed line conduit 102. Alternatively, the intermediate location 210 can be closer to the end 204 or 206 than the other end 206 or 204 of the feed line conduit 102.

The U-bend 208 in the feed line conduit 102 is formed by an upstream portion 212 of the feed line conduit 102 extending in a downward direction from the end 204 to the intermediate location 210 and by a downstream portion 214 of the feed line conduit 102 extending in an upward direction from the intermediate location 210 toward the gating 106 of the mold 104 (to which the end 206 of the feed line conduit 102 is coupled). The downstream portion 214 and the upstream portion 212 of the feed line conduit 102 are both located above the bend in the feed line conduit 102 along the growth direction 108. In the illustrated embodiment, the downstream end 206 of the feed line conduit 102 is above the gating 106 of the mold 104 and the upstream end 204 of the feed line conduit 102 is above the downstream end 206 of the feed line conduit 102 and (optionally) the gating 106 of the mold 104.

This shape of the feed line conduit 102 causes the molten metal to flow downward in the upstream portion 212 of the conduit 102 from the container 202 to the intermediate location 210, then upward through the downstream portion 214 of the conduit 102 to a downstream peak location 218 that is at the end of the downstream portion 214 and upstream of the end 206 that couples with the gating 106. The molten metal then flows down the conduit 102 from the peak location 218, through the gating 106, and into the mold 104 to be directionally solidified along the growth direction 108 in the mold 104 to form a cast object.

The gating 106 may be a rigid or semi-rigid body (e.g., flexible, but stiff enough that the body breaks or is irreparably damaged if bent too far). The gating 106 can be oriented in an upward angle relative to the length of the mold 104 or the growth direction 108. For example, the gating 106 may be oriented such that the force of gravity would pull the molten metal down through the gating 106 into the mold 104 and the angle between the direction in which the gating 106 is elongated and the growth direction 108 is less than forty-five degrees or is less than thirty degrees. The peak location 218 of the feed line conduit 102 may be the location in the conduit 102 to which the gating 106 extends inside the feed line conduit 102 or may be the location that is forced to bend downward so that the feed line conduit 102 can mate with the gating 106. This connection can cause the feed line conduit 102 to connect with the gating 106 in a downward direction that is oriented at an angle closer to the growth direction 108 than to a direction that is perpendicular to the growth direction 108. For example, the angle at which the feed line conduit 102 is oriented at the gating 106 may be within forty-five degrees of the growth direction 108.

In the illustrated embodiment, an anchor 216 is coupled with the feed line conduit 102. The feed line conduit 102 can be formed of a flexible material, such as wax, or the like. The feed line conduit 102 may need to be held in more rigid manner to ensure that the U-bend 208 does not flex during a subsequent shelling operation. The anchor 216 is a body that holds the conduit 102 in a more rigid way, The anchor 216 can be an elongated pole, pipe, or the like, that is connected with the feed line conduit 102 on one end of the anchor 216 and the ground or another surface beneath the feed line conduit 102 on the opposite end of the anchor 216. For example, the anchor 216 can hold the shape of the U-bend 208 in the feed line conduit 102, while the opposite ends 204, 206 of the feed line conduit 102 are coupled with locations (e.g., the container 202 and the gating 106) in locations that are above the intermediate location 210. Alternatively, the assembly 200 does not include the anchor 216. For example, the conduit 102 may be formed of a rigid material that maintains the U-bend 208 in the conduit 102.

Use of the U-bend 208 in the feed line conduit 102 reduces or eliminates the formation of stray grains growing in the object that is cast in the mold 104. As described above, stray grains can be metal crystals that do not have the same crystalline structure and/or have the same crystalline structure that is oriented in another direction as the grains that grow from a seed crystal in the mold 104. Introducing the U-bend 208 into the feed line conduit 102 can reduce or eliminate the entry of stray grains into the mold 104 from the conduit 102 or gating 106 as the molten metal flows from the container 202 into the mold 104 via the conduit 102 and the gating 106, as the metal contacts the seed crystal, and as the metal begins to cool and grow crystalline grains in the growth direction 108 within the mold 104.

Figure 3:
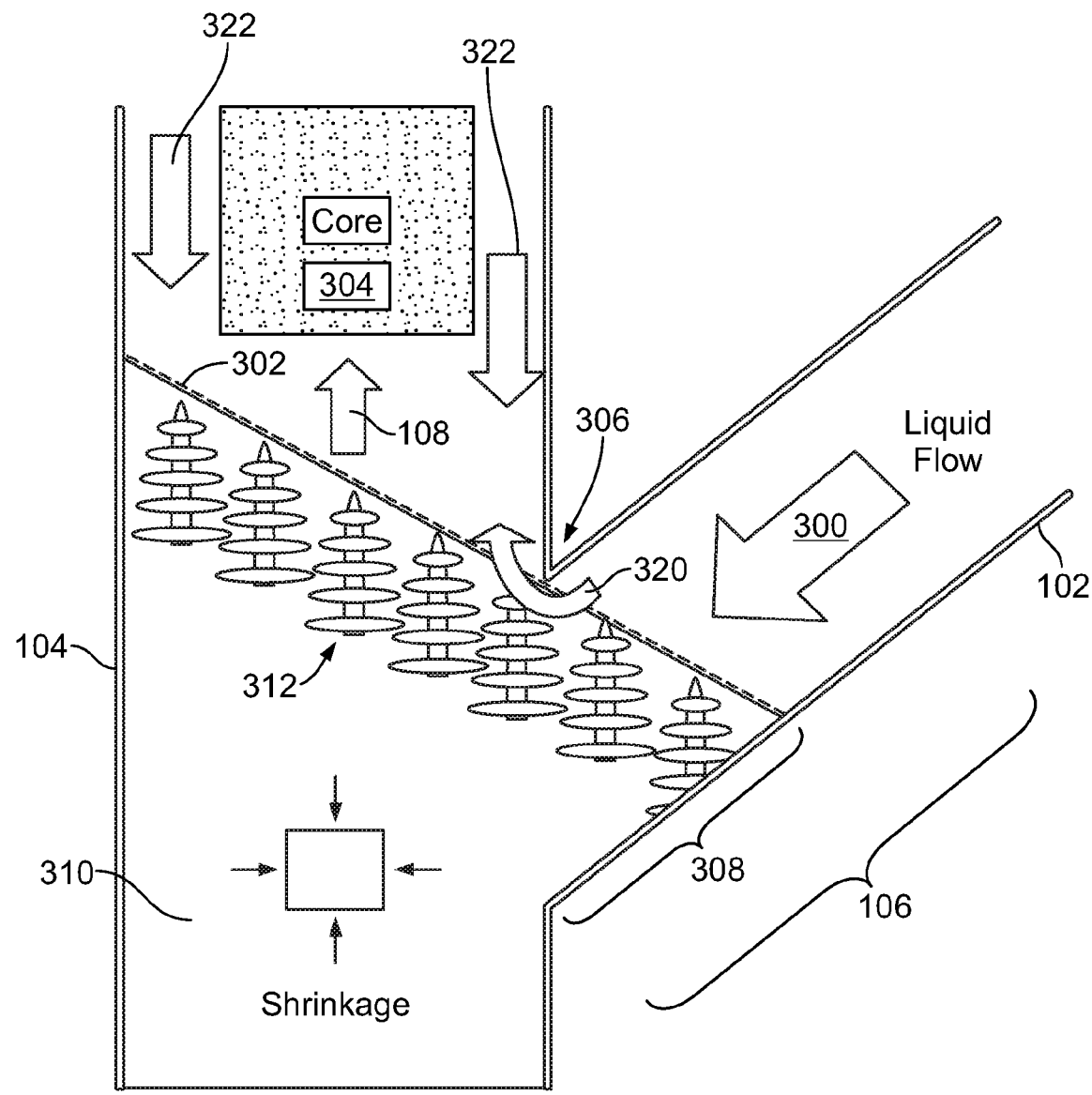
FIG. 3 schematically illustrates one example of operation of the casting assembly shown in FIG. 1 without a bend in the feed line conduit shown in FIG. 2.

FIG. 3 schematically illustrates one example of operation of the casting assembly 100 without the U-bend 208 in the feed line conduit 102. During casting of the object in the mold 104 without the bend 208 in the feed line conduit 102, molten metal 300 flows into the bottom of the mold 104 and solidifies along a solidification front 302. This solidification front 302 is formed of columns or dendrites 312 of crystalline grains that move or grow along the growth direction 108 into a core 304 of the mold 104.

In one embodiment, as the solidification front 302 moves past a joint 306 between the mold 104 and the feed line conduit 102 and an object 310 being cast in the mold 104, molten metal 300 may continue to flow 322 from the molten portion of the object 310 (e.g., inside the mold 104) and to flow 300 from the feed line conduit 102 to accommodate solidification and thermal shrinkage of the metal. If the liquid flow rate of the molten metal 300 coming from the feed line conduit 102 is greater than the liquid flow rate of the molten metal 322 from the object 310 (e.g., from inside the mold 104 to out into the feed line conduit 102 along directions 322 shown in FIG. 3), then a portion 320 of the liquid metal 300 may flow around the joint 306, break of the tips of the dendrites 312 and redeposit the broken tips on the surface of the object 310 being cast. This may introduce stray grains into the object 310 and can create a freckle chain in the grains.

Conversely, introducing the downward bend 208 in the feed line conduit 102 as shown in the assembly 200 can prevent this stray grain introduction into the object 310. The downward bend 208 causes the molten metal 300 in the feed line conduit 102 (e.g., within the bend 208) to solidify in the feed line conduit 102 after the molten metal fills the mold 104, but before the solidification front moves across the gating 106. This prevents further flow of the molten metal 300 from the feed line conduit 102 into the mold 104, which stops or reduces the flow of molten metal 300 around the joint 306 and into the object 310. This has been found to stop the generation of freckles in the object 310, which indicates that stray grains are not being introduced into the object 310.

Figure 4:
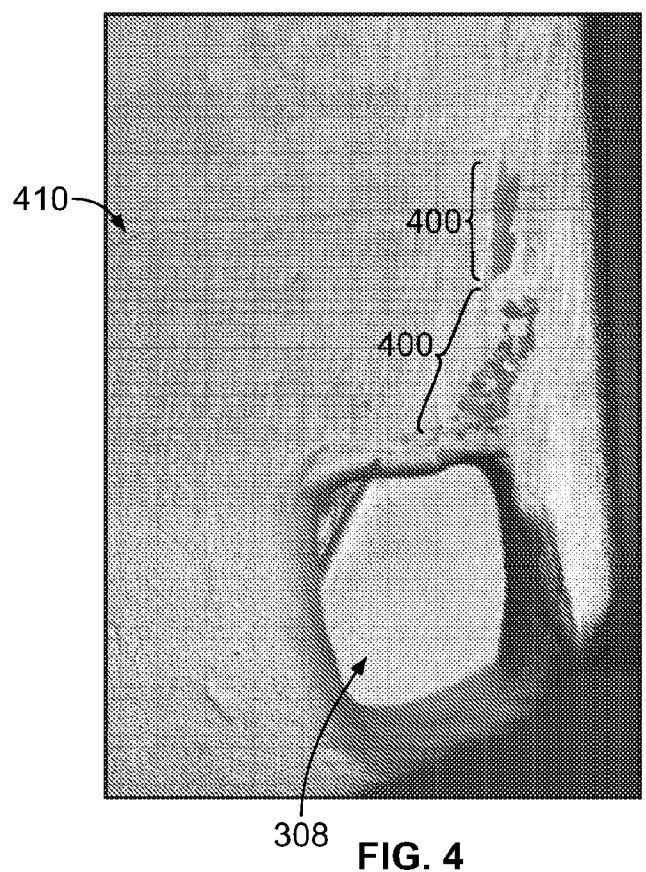
FIG. 4 is a photograph of a portion of an object cast using the casting assembly shown in FIG. 1.
Figure 5:
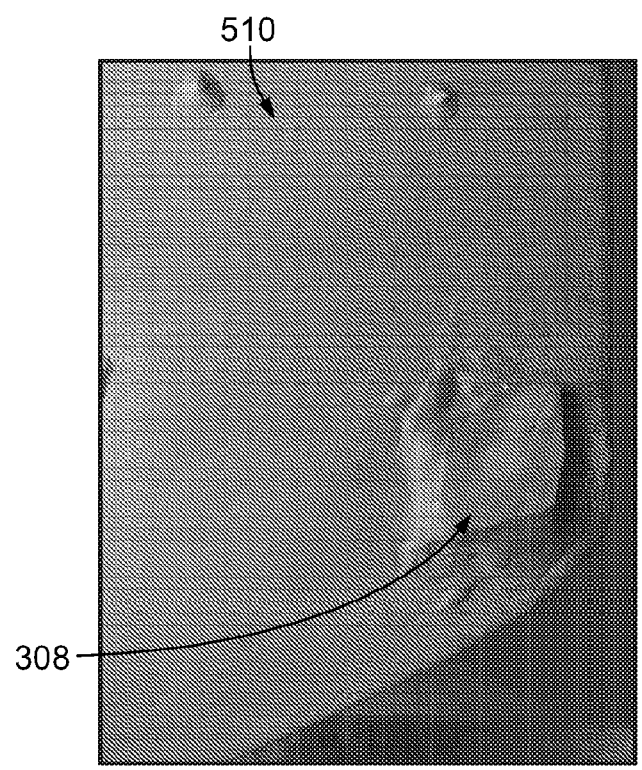
FIG. 5 is a photograph of a portion of an object cast using the casting assembly shown in FIG. 2.

FIGS. 4 and 5 are photographs of a portion of objects 410, 510 being cast using the casting assembly 100 (shown in FIG. 1) and the casting assembly 200 (shown in FIG. 2). The object 410 is part of a turbine blade that was cast in the mold 104 using the feed line conduit 102 of the casting assembly 100 that did not include the bend 208 in the feed line conduit 102. The object 510 is the same part of another turbine blade that was cast in the mold 104 using the feed line conduit 102 of the casting assembly 200 that did include the bend 208 in the feed line conduit 102.

As shown, the object 410 includes freckles 400 just below a gating 308 or connection between the mold 104 and the gating 106, while the object 510 does not have these freckles 400. The presence of the freckles 400 indicates that the object 410 includes stray grains in the crystalline structure of the object 410, while the absence of the freckles 400 from the object 510 indicates that the object 510 may not have stray grains in the crystalline structure of the object 510 at or near the gating 308. An object 410 having the freckles 400 may be discarded and not put into use (e.g., is not included in a turbine engine). Therefore, reducing or eliminating the freckles 400 and stray grains can reduce the amount of material and parts that are discarded.

Figure 6:
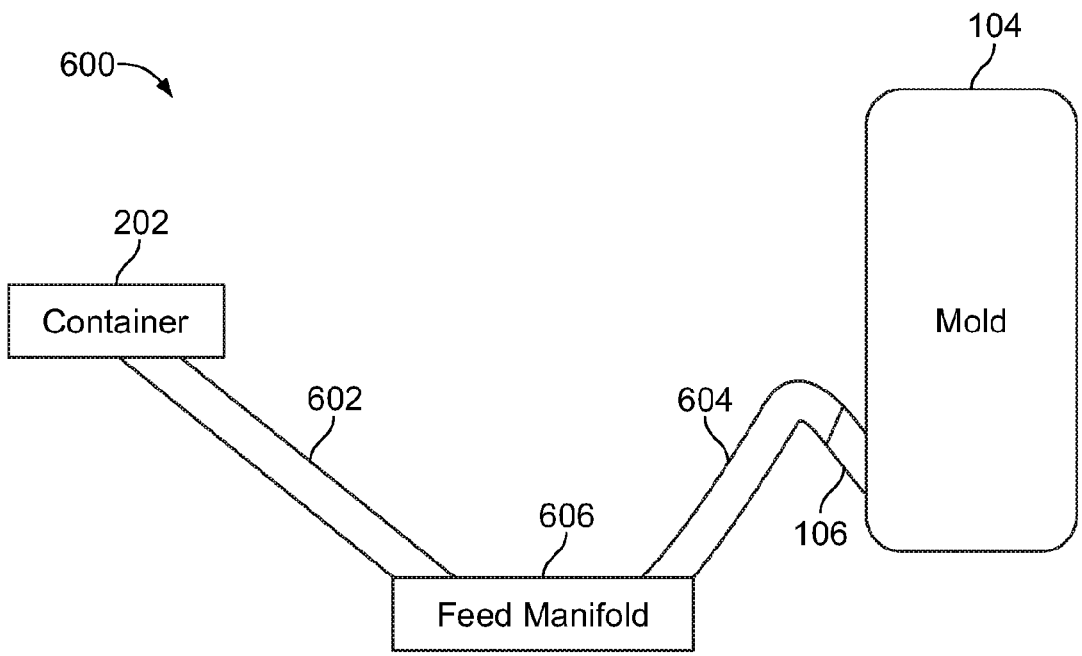
FIG. 6 illustrates a directional solidification casting assembly according to another embodiment.

FIG. 6 illustrates a directional solidification casting assembly 600 according to another embodiment. The casting assembly 600 includes the container 202 of molten metal, the gating 106, and the mold 104 described above. Optionally, the casting assembly 600 can include one or more additional components, such as the pig tail channel. The casting assembly 600 also includes a feed manifold 606 located beneath the gating 106 of the mold 104. An upstream feed line conduit 602 fluidly couples the container 202 with the manifold 606 so that the molten metal can flow from the container 202 into the manifold 606. The manifold 606 can include one or more internal channels to direct the molten metal into and up through a downstream feed line conduit 604 that is fluidly coupled with the upstream feed line conduit 602.

The downstream feed line conduit 604 also can be fluidly coupled with the gating 106 and the mold 104. The downstream feed line conduit 604 directs the molten metal into the mold 104 through the gating 106 to cast the object in the mold 104. As shown, the manifold 606 can be located below or lower than the gating 106 to prevent the flow of stray grains into the object being cast from the conduit 604. The downstream feed line conduit 604 can be coupled with the gating 106 at an upright angle or position (e.g., closer to a vertical orientation than a horizontal orientation, as shown in FIG. 6). This can help prevent molten metal from continuing to flow across the solidification front in the mold 104 due to the molten metal first solidifying beneath the gating 106 and/or not being able to flow uphill and into the mold 104 through the gating 106. For example, the molten metal 300 in the downstream feed line conduit 604 can solidify after the molten metal fills the mold 104, but before the solidification front moves across the gating 106. As described above, this prevents further flow of the molten metal 300 from the downstream feed line conduit 604 into the mold 104, which stops or reduces the flow of molten metal 300 around the joint 306 and into the object being cast in the mold.

Figure 7:
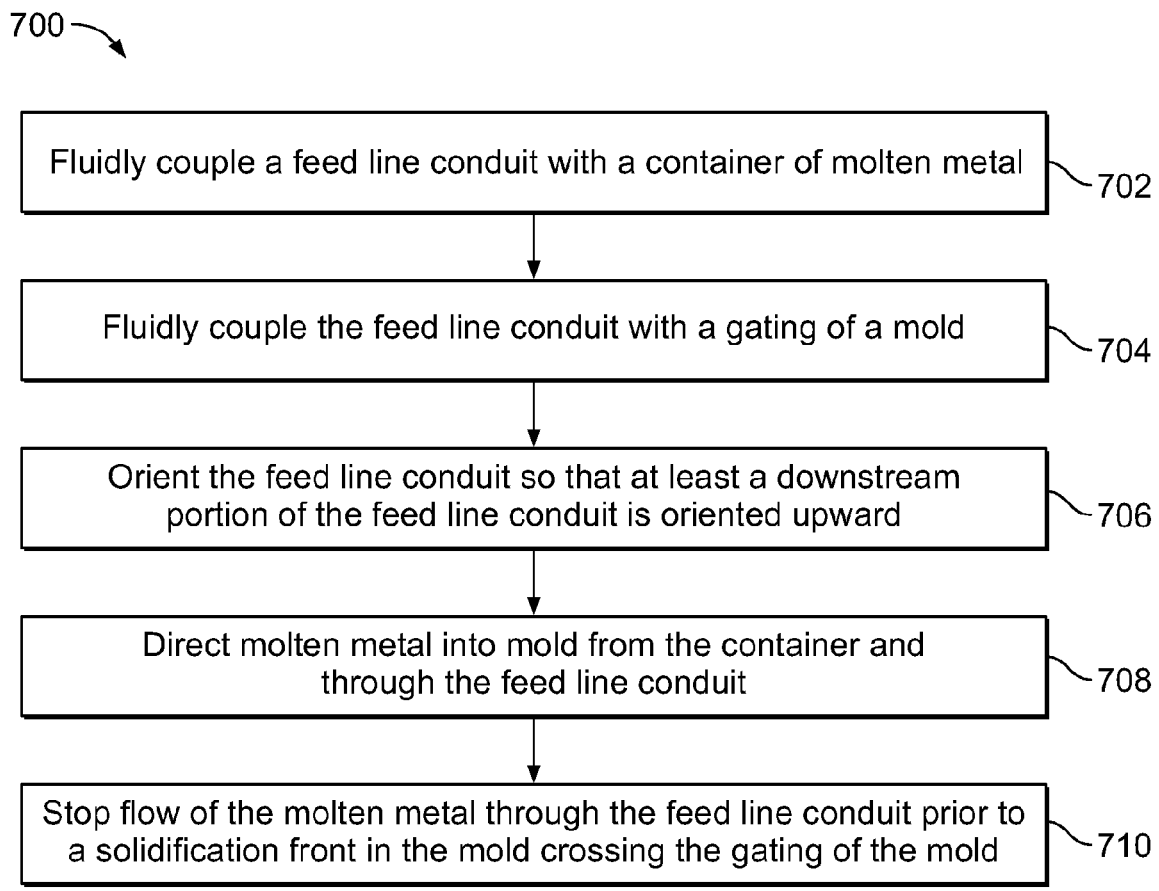
FIG. 7 illustrates a flowchart of one embodiment of a method for casting an object using directional solidification.

FIG. 7 illustrates a flowchart of one embodiment of a method 700 for casting an object using directional solidification. The method 700 can use one or more of the casting assemblies described herein or can be used with another casting assembly. At 702, a feed line conduit is fluidly coupled with a container or other source of molten metal. For example, one open end of the conduit can be connected with an opening into the container or other source. At 704, the feed line conduit is fluidly coupled with a gating of a mold. The feed line conduit can be connected with the gating such that the portion of the feed line conduit that mates with the gating is vertically oriented or close to a vertical orientation. For example, the portion of the feed line conduit that mates with the gating can be oriented at an angle that is less than thirty degrees from a vertical direction (relative to the direction of gravity).

At 706, at least a downstream portion of the feed line conduit is oriented upward toward or to the gating of the mold. For example, a convex bend may be formed in the feed line conduit (with or without use of an anchor) such that one portion of the feed line conduit that extends to another portion of the feed line conduit (that mates with the gating) extends upward (and not downward or horizontally). Alternatively, the entire feed line conduit can extend from a manifold located below the gating up to the gating.

At 708, molten metal is directed into the mold from the container through the feed line conduit. The molten metal can be pumped through the feed line conduit and/or can flow through the feed line conduit due to gravity. The molten metal may begin solidifying in the mold with a solidification front moving in the mold in an upward or vertical direction. A cooling plate may be positioned beneath the mold to cause the solidification front to move upward. At 710, flow of the molten metal through the feed line stops or slows prior to the solidification front growing past and crossing the gating of the mold. (For example, the flow rate of metal from the feed line conduit can slow down to be slower than the flow rate of metal from the molten portion of the object being cast in the mold. As described above, stopping the flow of the molten metal in the feed line conduit prior to the solidification front passing the gating can prevent stray grains from forming in the object being cast in the mold.

In one embodiment, a directional solidification casting assembly is provided. The assembly includes a container source of a molten metal, a directional solidification mold having an interior chamber with a shape of an object to be cast using directional solidification of the molten metal in a growth direction of the mold, and a feed line conduit having a length that extends from a first open end to a second open end with an intermediate location between the first and second open ends. The first open end of the feed line conduit is fluidly coupled with the container source. The second open end of the feed line conduit is fluidly coupled with the mold at a gating. The feed line conduit is configured to convey the molten metal into the mold through the gating for directional solidification of the object to be cast in the mold. At least a downstream portion of the feed line conduit that is between the intermediate location of the feed line conduit and the second open end of the feed line conduit is located below the gating along the growth direction of the mold. Optionally, the assembly does not include the container source of the metal, but is fluidly coupled with this container source.

Optionally, the mold is configured to receive the molten metal for directionally solidifying the object as one or more of a single crystal grain structure or a columnar crystal structure in the mold.

Optionally, the feed line conduit has a bend in the length of the feed line conduit such that the downstream portion of the feed line conduit and an upstream portion of the feed line conduit between the first open end and the bend are both located above the bend in the feed line conduit along the growth direction.

Optionally, the assembly also includes an anchor coupled with the feed line conduit at the intermediate location and configured to hold the intermediate location of the feed line conduit below the first and second open ends of the feed line conduit along the growth direction.

Optionally, the downstream portion of the feed line conduit is angled upward toward the gating along the growth direction of the mold.

Optionally, the feed line conduit connects with the gating in a downward direction that is oriented at an angle that is closer to the growth direction than to a direction that is perpendicular to the growth direction.

Optionally, the feed line conduit connects with the gating at an angle that is within thirty degrees of the growth direction.

In one embodiment, a directional solidification casting method is provided. The method includes fluidly coupling a first open end of a feed line conduit with a container source of a molten metal and fluidly coupling an opposite, second open end of the feed line conduit with a directional solidification mold at a gating of the mold. The mold has an interior chamber with a shape of an object to be cast using directional solidification of the molten metal in a growth direction of the mold. The method also includes positioning at least a downstream portion of the feed line conduit below the gating of the mold along the growth direction. The downstream portion of the feed line conduit extends between the second open end of the feed line conduit and an intermediate location in the feed line conduit between the first and second open ends. The method also includes directing the molten metal into the mold via the feed line conduit and casting the object in the mold using directional solidification.

Optionally, casting the object includes directionally solidifying the object as one or more of a single crystal grain structure or a columnar crystal structure in the mold.

Optionally, positioning the feed line conduit includes forming a bend in the length of the feed line conduit such that the downstream portion of the feed line conduit and at least an upstream portion of the feed line conduit are both located above the bend in the feed line conduit along the growth direction. The upstream portion of the feed line conduit can be located between the first open end and the bend.

Optionally, the method also includes coupling an anchor with the feed line conduit at the intermediate location. The anchor can hold the intermediate location of the feed line conduit below the first and second open ends of the feed line conduit along the growth direction.

Optionally, the downstream portion of the feed line conduit is angled upward toward the gating along the growth direction of the mold.

Optionally, the feed line conduit connects with the gating in a downward direction that is oriented at an angle that is closer to the growth direction than to a direction that is perpendicular to the growth direction.

Optionally, the feed line conduit connects with the gating at an angle that is within thirty degrees of the growth direction.

In one embodiment, a directional solidification casting assembly is provided. The assembly includes a directional solidification mold having an interior chamber with a shape of an object to be cast using directional solidification of molten metal in a growth direction of the mold and a feed line conduit having a length that extends from a first open end to a second open end. The first open end of the feed line conduit is fluidly coupled with the container source. The second open end of the feed line conduit is fluidly coupled with the mold at a gating. The feed line conduit is configured to convey the molten metal into the mold through the gating for directional solidification of the object to be cast in the mold. The feed line conduit connects with the gating in a downward direction that is oriented at an angle that is closer to the growth direction than to a direction that is perpendicular to the growth direction.

Optionally, the feed line conduit connects with the gating at an angle that is within thirty degrees of the growth direction.

Optionally, at least a downstream portion of the feed line conduit that is between an intermediate location of the feed line conduit and the second open end of the feed line conduit is located below the gating along the growth direction of the mold.

Optionally, the mold is configured to receive the molten metal for directionally solidifying the object as a single crystal grain structure in the mold.

Optionally, the feed line conduit has a bend in the length of the feed line conduit such that the downstream segment of the feed line conduit and an upstream portion of the feed line conduit between the first open end and the bend are both located above the bend in the feed line conduit along the growth direction.

Optionally, the assembly also includes an anchor coupled with the feed line conduit at the intermediate location and configured to hold the intermediate location of the feed line conduit below the first and second open ends of the feed line conduit along the growth direction.

Optionally, the downstream portion of the feed line conduit is angled upward toward the gating along the growth direction of the mold.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the inventive subject matter without departing from its scope. While the dimensions and types of materials described herein are intended to define the parameters of the inventive subject matter, they are by no means limiting and are exemplary embodiments. Many other embodiments will be apparent to one of ordinary skill in the art upon reviewing the above description. The scope of the inventive subject matter should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. § 112(f), unless and until such claim limitations expressly use the phrase "means for" followed by a statement of function void of further structure.

This written description uses examples to disclose several embodiments of the inventive subject matter to enable one of ordinary skill in the art to practice the embodiments of inventive subject matter, including making and using any devices or systems and performing any incorporated methods. The patentable scope of the inventive subject matter is defined by the claims, and may include other examples that occur to one of ordinary skill in the art. Such other examples are intended to be within the scope of the claims if they have structural elements that do not differ from the literal language of the claims, or if they include equivalent structural elements with insubstantial differences from the literal languages of the claims.

The foregoing description of certain embodiments of the present inventive subject matter will be better understood when read in conjunction with the appended drawings. The various embodiments are not limited to the arrangements and instrumentality shown in the drawings.

As used herein, an element or step recited in the singular and proceeded with the word "a" or "an" should be understood as not excluding plural of said elements or steps, unless such exclusion is explicitly stated. Furthermore, references to "one embodiment" of the present invention are not intended to be interpreted as excluding the existence of additional embodiments that also incorporate the recited features. Moreover, unless explicitly stated to the contrary, embodiments "comprising," "comprises," "including," "includes," "having," or "has" an element or a plurality of elements having a particular property may include additional such elements not having that property.

What is claimed is:

1. A directional solidification casting assembly comprising:
    a directional solidification mold having an interior chamber with a shape of an object to be cast using directional solidification of molten metal in a growth direction of the mold;
    a feed line conduit having a length that extends from a first open end to a second open end with an intermediate location between the first and second open ends; and
    a feed manifold disposed beneath the mold and disposed at the intermediate location of the feed line, the first open end of the feed line conduit configured to be fluidly coupled with a container source of the molten metal, the second open end of the feed line conduit configured to be fluidly coupled with the mold at a gating, the feed line conduit configured to convey the molten metal from the container source into the feed manifold, then from the feed manifold into the mold through the gating for directional solidification of the object to be cast in the mold,
    wherein at least a downstream portion of the feed line conduit that is between the intermediate location of the feed line conduit and the second open end of the feed line conduit is located below the gating along the growth direction of the mold, wherein the feed line conduit connects with the gating in a downward direction that is oriented at an angle that is closer to the growth direction than to a direction that is perpendicular to the growth direction.

2. The directional solidification casting assembly of claim 1, wherein the mold is configured to receive the molten metal for directionally solidifying the object as one or more of a single crystal grain structure or a columnar crystal structure in the mold.

3. The directional solidification casting assembly of claim 1, wherein the downstream portion of the feed line conduit is angled upward toward the gating along the growth direction of the mold.

4. The directional solidification casting assembly of claim 1, wherein the feed line conduit connects with the gating at an angle that is within thirty degrees of the growth direction.

* * * * *